US006864819B2

(12) United States Patent
Wang (10) Patent No.: US 6,864,819 B2
(45) Date of Patent: *Mar. 8, 2005

(54) STATE DELAYED TECHNIQUE AND SYSTEM TO REMOVE TONES OF DYNAMIC ELEMENT MATCHING

(75) Inventor: Minsheng Wang, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/784,934

(22) Filed: Feb. 25, 2004

(65) Prior Publication Data

US 2004/0222909 A1 Nov. 11, 2004

Related U.S. Application Data

(63) Continuation of application No. 10/434,220, filed on May 9, 2003, now Pat. No. 6,720,897.

(51) Int. Cl.[7] .............................................. H03M 3/00
(52) U.S. Cl. ...................................... 341/143; 341/144
(58) Field of Search ......................... 341/143, 61, 144, 341/155

(56) References Cited

U.S. PATENT DOCUMENTS

| | | | | |
|---|---|---|---|---|
| 6,124,813 A | * | 9/2000 | Robertson et al. ........... | 341/143 |
| 6,292,124 B1 | * | 9/2001 | Hanada et al. ............... | 341/152 |
| 6,466,153 B1 | * | 10/2002 | Yu .............................. | 341/161 |
| 6,518,899 B2 | * | 2/2003 | Yu .............................. | 341/118 |
| 6,545,623 B1 | * | 4/2003 | Yu .............................. | 341/155 |
| 6,577,261 B2 | * | 6/2003 | Brooks et al. ............... | 341/144 |
| 6,583,742 B1 | * | 6/2003 | Hossack ...................... | 341/144 |
| 6,720,897 B1 | * | 4/2004 | Wang .......................... | 341/143 |
| 2002/0180629 A1 | | 12/2002 | Liu et al. .................... | 341/143 |

FOREIGN PATENT DOCUMENTS

| | | | | |
|---|---|---|---|---|
| EP | 1 202 459 A2 | 5/2002 | ............ | H03M/1/06 |
| GB | 2 356 301 A | 5/2001 | ............ | H03M/1/24 |
| WO | WO 2004/006440 A1 | 1/2004 | ............ | H03M/3/00 |

OTHER PUBLICATIONS

Kwan, Shuffler Apparatus and Related Dynamic Element Matching Technique for Linearization of Unit–Element Digital to Analog Converters, Fig. 2a, US 2003/0137439, 2003.

Yasuda et al., "A Third–Order Δ–Σ Modulator Using Second–Order Noise–Shaping Dynamic Element Matching," IEEE Journal of Solid–State Circuits, vol. 33, No. 12, pp. 1879–1886, IEEE (Dec. 1998).

Kwan et al., "A Stereo Multibit ΣΔ DAC with Asynchronous Master–Clock Interface," IEEE Journal of Solid–State Circuits, vol. 31, No. 12, pp. 1881–1887, IEEE (Dec. 1996).

Adams et al., "A 113–dB SNR Oversampling DAC with Segmented Noise–Shaped Scrambling," IEEE Journal of Solid–State Circuits, vol. 33, No. 12, pp. 1871–1878, IEEE (Dec. 1998).

Welz et al., "Simplified Logic for First–Order and Second–Order Mismatch–Shaping Digital–to–Analog Converters." IEEE Transactions on Circuits and Systems–II: Analog and Digital Signal Processing, vol. 48, No. 11, pp. 1014–1027, IEEE, (Nov. 2001).

(List continued on next page.)

*Primary Examiner*—Peguy JeanPierre
(74) *Attorney, Agent, or Firm*—Sterne, Kessler, Goldstein & Fox P.L.L.C.

(57) ABSTRACT

A filter structure used with a dynamic element matching encoder for a sigma-delta digital-to-analog converter is presented. A sampled input sequence having undesired frequency tones is divided into even and odd data subsequences. Each of the sub-sequences is processed by a dynamic element matching encoder, with a transfer function $H(z^{-1})$. The resulting processed sub-sequences are combined into an output sequence. The undesired frequency tones are substantially reduced in the output sequence.

15 Claims, 10 Drawing Sheets

OTHER PUBLICATIONS

Grilo et al., "A 12–mW ADC Delta–Sigma Modulator With 80 dB of Dynamic Range Integrated in a Single–Chip Bluetooth Transceiver," IEEE Journal of Solid–State Circuits, vol. 37, No. 3, pp. 271–278, IEEE (Mar. 2002).

Ian Galton, "Spectral Shaping of Circuit Errors in Digital–to–Analog Converters," IEEE Transactions on Circuits and Systems—II: Analog and Digital Signal Processing vol. 44, No. 10 pp. 808–817, IEEE (Oct. 1997).

Norsworthy et al., Delta–Sigma Data Converters: Theory, Design and Simulation, pp. 185–186, IEEE Press, 1999.

Zelniker et al., Advanced Digital Signal Processing: Theory and Applications, pp. 357–364, Marcel Dekker, Inc. (1994).

Morteza Vadipour, "Techniques for Preventing Tonal Behavior of Data Weighted Averaging Algorithm in $\Sigma$–$\Delta$ Modulators," IEEE Transactions on Circuits and Systems–II: Analog and Digital Signal Processing, vol. 47, No. 11, pp. 1137–1144, IEEE (Nov. 2000).

Chen et al., "Some Observations on Tone Behavior in Data Weighted Averaging," Proceedings of the 1998 International Symposium on Circuits and Systems, vol. 1, pp. 500–503, IEEE (1998).

Chen et al., "An Improved Technique for Reducing Baseband Tones in Sigma–Delta Modulators Employing Data Weighted Averaging Algorithm Without Adding Dither," IEEE Transactions on Circuits and Systems–II: Analog and Digital Signal Processing, vol. 46., No. 1, pp. 63–68, IEEE (Jan. 1999).

Radke et al., "A 14–Bit Current–Mode $\Sigma\Delta$ DAC Based Upon Rotated Data Weighted Averaging," IEEE Journal of Solid–State Circuits, vol. 35, No. 8, pp. 1074–1084, IEEE (Aug. 2000).

Baird et al., "Improved $\Delta\Sigma$ DAC Linearity Using Data Weighted Averaging", pp. 13–16, IEEE (1995).

Radke et al., "A Spurious–Free Delta–Sigma DAC Using Rotated Data Weighted Averaging," IEEE 1999 Custom Integrated Circuits Conference, pp. 125–128, IEEE (1999).

Jensen et al., "A Low–Complexity Dynamic Element Matching DAC for Direct Digital Synthesis," IEEE Transactions on Circuits and Systems–II: Analog and Digital Signal Processing, vol. 45, No. 1, pp. 13–27, IEEE (Jan. 1998).

Annovazzi et al., A Low–Power 98–dB Multibit Audio DAC in a Standard 3.3–V 0.35–$\mu$m CMOS Technology, IEEE Journal of Solid–State Circuits, vol. 37, No. 7, pp. 825–834, IEEE (Jul. 2002).

Weltz et al., "A Necessary and Sufficient Condition for Mismatch Shaping in Multi–Bit DACS," IEEE, pp. I–105 to I–108, IEEE (2002).

Fogleman et al., "A Digital Common–Mode Rejection Technique for Differential Analog–to–Digital Conversion," IEEE Transactions on Circuits and Systems–II: Analog and Digital Signal Processing, vol. 48, No. 3, pp. 255–271, IEEE (Mar. 2002).

Lin et al., "A Bandpass Mismatch–Shaped Multi–Bit $\Sigma\Delta$ Switched–Capacitor DAC using Butterfly Shuffler," 1999 IEEE International Solid–State Circuits Conference, 0–783–5129–0/99, IEEE (1999).

European Search Report from counterpart European application EP 04008879, 3 pp May 8, 2004.

* cited by examiner

FIG. 14A
SPECTRUM OF THE DAC ERROR WITH THE TONE-FREE DEM ENCODER

FIG. 14B
SPECTRUM OF THE DAC ERROR WITH THE DEM ENCODER

FIG. 15
NARROW-BAND NOISE POWER FOR $H(z^{-1})$ AND $H(z^{-2})$

FIG. 16A
SPECTRUM OF THE DAC ERROR WITH THE DWA

FIG. 16B
SPECTRUM OF THE DAC ERROR WITH THE TONE-FREE DWA

STATE DELAYED TECHNIQUE AND SYSTEM TO REMOVE TONES OF DYNAMIC ELEMENT MATCHING

CROSS-REFERENCE TO RELATED APPLICATIONS

This application is a continuation of U.S. patent application No. 10/434,220, filed May 9, 2003 which is now a U.S. Pat. No. 6,720,897, entitled State-Delayed Technique and System to Remove Tones of Dynamic Element Matching, incorporated herein by reference in its entirety.

This application is related to U.S. patent application No. 11/354,159, filed Jan. 30, 2003, entitled HARDWARE-EFFICIENT IMPLEMENTATION OF DYNAMIC ELEMENT MATCHING IN SIGMA-DELTA DAC'S, incorporated herein by reference in its entirety.

BACKGROUND OF THE INVENTION

In high resolution digital-to-analog converters (DACs), performance metrics such as linearity and noise are nominally determined by the matching of parameters derived from physical quantities in the construction of the DACs on an integrated circuit (IC), such as width, length, thickness, doping, etc. As a general rule, for each additional bit of performance in the DAC, parameter matching needs to be twice as tight. This translates to an increase by a factor of four in the IC area required by the DAC. When the DAC resolution is in the 16-bit range, it is no longer practical or economical to use size alone to achieve the required matching.

Over-sampled (delta-sigma or $\Delta$-$\Sigma$) DACs alleviate the need for raw matching using single-bit conversion (so called 1-bit DACs in CD players). A single-bit DAC has only two points in a transfer function of the DAC, and thus is inherently linear. The function of a $\Delta$-$\Sigma$ modulator with a one-bit quantizer is to approximate a high-resolution, low-frequency signal with a high-frequency two-level signal. The drawback is that this produces large amounts of out-of-band, for example, high frequency, noise.

Multi-bit DACs have the advantage of significantly increasing the precision limit of the single-bit DAC. The major drawback of the multi-bit DAC is the non-linearity presented by the imperfect analog circuit mismatches. Specifically, the non-linearity stems from the mismatching between the unit DAC elements, and causes significant performance degradation. (For purposes of this application, the terms "DAC element" and "unit DAC element" may be used interchangeably.)

One method of reducing this non-linearity is dynamic element matching (DEM). DEM is a method of randomizing the use of the individual unit DAC elements so that each DAC element is used equally as often, and averaging the errors in each DAC element. Two common methods of DEM are tree-structured DEM and data weighted averaging (DWA) DEM. In tree-structured DEM, incoming code is shuffled before it enters the unit DAC elements. Tree-structured DEM is called such because the input code is split into two numbers, which are shuffled and then split into four numbers, which are shuffled, and so on.

In DWA DEM, a pointer keeps track of the number of DAC elements in use. For each unit DAC element used when a sample of thermometer code is input, the pointer moves to the next DAC element. If the next DAC element in line is unused, then the pointer does not move, but stays pointing at the unused DAC element. When the next sample of thermometer code is input, the first DAC element used is the one to which the pointer is pointing, and successive DAC elements are used in line order. In both the tree-structured method and the DWA method, each DAC element is used as often as every other DAC element, reducing any non-linearity.

However, for multi-bit $\Delta$-$\Sigma$ modulators, it has been found that using tree-structured and DWA algorithms causes in-band tones for a certain level of input signals. This effect can be tracked back to the cyclic nature of the selection of unit DAC elements when the input to the modulator is small. When the modulator's input magnitude is very small, the large portion of the DAC input codes are almost exclusively concentrated at the middle of the full scale of the modulator's internal DAC elements. For data with a sample rate of Fs, the consecutive occurrence of mid-code into the DAC results in the notable tones with frequencies around Fs/2 appearing in the modulator output spectrum.

Take an example of a nine-level DAC that uses eight unit DAC elements. The input digital code ranges from 0 to 8, with the mid-code of 4. Assume the errors for the unit DAC elements are $e_i$, i=0, 1, . . . , 7. For the DWA with input DAC sequence codes 4, 4, 4, 4, . . . , the DAC output noise manifests as a Fs/2-periodic sequence, $e_0+e_1+e_2+e_3$, $e_4+e_5+e_6+e_7$, $e_0+e_1+e_2+e_3$, $e_4+e_5+e_6+e_7$, . . . , where Fs is the sampling frequency. For the tree-structured DEM, the same input codes produce the DAC output as another Fs/2-periodic sequence, $e_0+e_2+e_4+e_6$, $e_1+e_3+e_5+e_7$, $e_0+e_2+e_4+e_6$, $e_1+e_3+e_5+e_7$, . . . The dither to the quantizer of the modulator does not help too much, as its effect is merely to amplitude-modulate the Fs/2 tone. For example, the codes 3, 5, 3, 5 for DWA produces the DAC output as an Fs/2-periodic sequence, $e_0+e_1+e_2$, $e_3+e_4+e_5+e_6+e_7$, $e_0+e_1+e_2$, $e_3+e_4+e_5+e_6+e_7$, . . . The similar amplitude-modulated Fs/2 tones are generated for the tree-structure with the same input codes.

There have been several patents and other references addressing the tone problems and the techniques to remove it. See, e.g., I. Galton, "Spectral Shaping of Circuit Errors in Digital-to-Analog Converters", *IEEE Trans. on Circuits and Systems-II: Analog and Digital Signal Processing*, pp. 808–817, vol. 44, no. 10, October 1997; J. Grilo et al., "A 12-mW ADC Delta-Sigma Modulator with 80 dB of Dynamic Range Integrated in a Single-Chip Bluetooth Transceiver", *IEEE Journal of Solid-State Circuits*, pp. 271–278, vol. 37, March 2002; J. Welz et al., "Simplified Logic for First-Order and Second-Order Mismatch-Shaping Digital-to-Analog Converters", *IEEE Trans. on Circuits and Systems-II: Analog and Digital Signal Processing*, pp. 1014–1027, vol. 48, no. 11, November 2001; R. Adams et al., "A 113-db SNR Oversampling DAC with Segmented Noise-Shaped Scrambling", *IEEE Journal of Solid State Circuits*, pp. 1871–1878, vol. 33, no. 12, December 1998; T. Kwan et al., "A Stereo Multibit $\Sigma\Delta$ DAC with Asynchronous Master-Clock Interface", *IEEE Journal of Solid-State Circuits*, pp. 1881–1887, vol. 31, no. 12, December 1996; A. Yasuda et al., "A Third-Order $\Sigma\Delta$ Modulator Using Second-Order Noise-Shaping Dynamic Element Matching", *IEEE Journal of Solid-State Circuits*, pp. 1879–1886, vol. 33, no. 12, December 1998; R. Radke et al., "A Spurious-Free Delta-Sigma DAC Using Rotated Data Weighted Averaging", *IEEE Custom Integrated Circuits Conference*, 1999, pp. 125–128; R. Baird and T. S. Fiez, "Improved $\Delta\Sigma$ DAC Linearity Using Data Weighted Averaging", *IEEE International Symposium*, vol. 1, pp. 13–16, 1995; R. Radke et al., "A 14-bit Current-Mode $\Sigma\Delta$ DAC Based Upon Rotated Data Weighted Averaging", *IEEE Journal of Solid State Circuits*, vol. 35, no. 8, August 2000; Kuan-Dar Chen and T. Kuo, "An Improved Technique for Reducing Baseband Tones in Sigma-Delta Modulators Employing Data Weighted Averaging Algorithm Without Adding Dither", *IEEE Trans. on Circuits and Systems-II: Analog and Digital Signal Processing*, vol. 46, no. 1, January 1999; F. Chan and B. Leung, "Some Observations on Tone Behavior in Data Weighted Averaging", *Proceedings of the 1998 IEEE International Symposium on Circuits and Systems, vol.* 1, pp. 500–503, 1998; M. Vadipour, "Techniques for Preventing Tonal Behavior of Data Weighted Averaging Algorithm in $\ominus\Delta$ Modulators", *IEEE Trans. on Circuits and Systems-II: Analog and Digital Signal Processing*, vol. 47, no. 11, November 2000; G. Zelniker and F. Taylor, *Advanced Digital Signal Processing: Theory and Applications*, Marcel Dekker, Inc., New York, 1994, pp. 357–364; and S. R. Norsworthy et at., *Delta-Sigma Data Converters: Theory, Design, and Simulation*", pp. 185–186, IEEE Press, New York, 1997.

Dithering has been proposed for removal of these tones (see R. Radke, "Improved", cited above), but the improvement in tonal performance is limited and results in signal-to-noise ratio (SNR) degradation. Another technique uses extra unit DAC elements to move the tones out of the baseband (see Kuan-Dar Chen, cited above). Rotational DWA switches randomly between different patterns for DAC selection (see R. Radke, "Spurious" and R. Radke, "14-bit", cited above), but the ROM hardware that stores the transition states is not trivial. Another technique adds an offset to shift the tone out of the baseband (see M. Vadipour, cited above). In addition, randomized DWA is used to reduce the hardware complexity of the rotational DWA. This tends to sacrifice SNR performance. For the tree-structured DEM (see I. Gafton, J. Grilo, and J. Welz, cited above), a dither at every other sample helps reduce the tone, but this too sacrifices SNR performance.

SUMMARY OF THE INVENTION

To reduce Fs/2 tones in an output data stream produced by dynamic element matching ("DEM"), a state-delayed technique and system is used. It is applicable to both the tree-structured DEM a nd DWA DEM. No dither is required for this invention, and the in-band SNR degradation is less than 6 dB. The total SNR does not change. Further, the hardware cost of the present invention is minimal. For a nine-level DAC that uses eight unit DAC elements, the preferred embodiment of the invention only requires a seven-bit shift register for the tree-structured DEM, or a three-bit register for the DWA DEM.

An input data stream having a data sample rate equal to Fs is sent to an input stage. The input stage separates even and odd data samples from the input data stream. The even samples are sent in an even data stream to a first DEM stage, and the odd samples are sent in an odd data strewn to a second DEM stage. In the first DEM stage, each even sample is shuffled depending on the prior state of an even swapper. In the second DEM stage, each odd sample is shuffled depending on the prior state of an odd swapper. The shuffled even and odd samples are then combined to produce a shuffled output stream. Since the even and odd samples were shuffled separately, the combiner acts like an $H(z^{-2})==1-z^{-2}$ filter. Since an $H(z^{-2})$ filter has a null at Fs/2, Fs/2 tones are dramatically reduced in the shuffled output.

Additional features and advantages of the invention will be set forth in the description that follows. Yet further features and advantages will be apparent to a person skilled in the art based on the description set forth herein or may be learned of by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/ FIGURES

The accompanying drawings, which are incorporated herein and form a part of the specification, illustrate the present invention and, together with the description, further serve to explain the principles of the invention and to enable a person skilled in the pertinent art to make and use the invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

As used herein, the following terms are defined:

Dynamic element matching ("DEM") is a method of randomizing over time the use of individual unit digital-to-analog (DAC) elements in a DAC so that each unit DAC element is used (e.g., converts a logic "1" to an analog voltage or current) equally as often, thereby averaging DAC element errors across all of the unit DAC elements. As used here, the term DEM refers to any type of dynamic element matching. Example types of DEM include tree-structured DEM and data weighted averaging ("DWA") DEM. An element that performs DEM is called a "DEM encoder." A typical DEM process performed on a series of digital data samples includes rearranging or permuting the order of bits in at least some of the digital data samples, to produce a series of rearranged digital data samples. This is also referred to as "data sample rearrangement." Preferably, the data sample rearrangement is performed in such a way as to achieve the equal usage of the unit element DACs and the averaging of errors mentioned above.

"Shuffling" is herein used interchangeably and equivalently with the term "DEM." This is true even if, as in the case of DWA DEM, no data sample rearrangement actually occurs before the sample enters the DAC. Thus, a "shuffled data sample" is a data sample that has been through a DEM process, even if, as in the case of DWA DEM, the sample has not been rearranged before it enters the DAC.

"DAC element" and "unit DAC element" may be used interchangeably.

One "sample period" is the time between consecutive samples in an input data stream.

An example DEM system in which the present invention may be used is discussed in U.S. patent application Ser. No. 10/354,159, filed Jan. 30, 2003, entitled "Hardware-Efficient Implementation of Dynamic Element Matching in Sigma-Delta DAC's," incorporated herein by reference in its entirety.

Two common methods of DEM are tree-structured DEM and data weighted averaging ("DWA") DEM.

Figure 1:
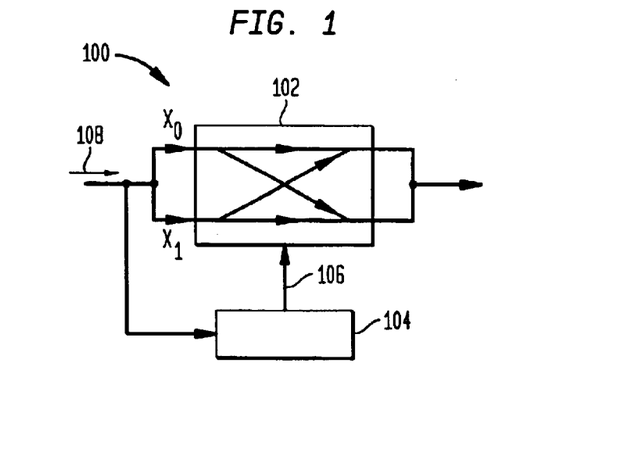
FIG. 1 is a high-level block diagram of an example state-influenced swapper.

FIG. 1 is a high level block diagram of a state-based swapper system 100 that may be used in, for example, tree-structured DEM. State-based swapper system 100 includes a swapper 102 coupled to a state register 104. State register 104 holds a state value initially set to a value of either "1" or "0". State register 104 sends the state value to swapper 102 over interface 106. An input data stream 108 including incoming data samples is sent to both swapper 102 and state register 104 at a sample rate Fs. Each data sample is represented by at least two logic bits.

Depending on the state value sent to swapper 102 by state register 104, each of the incoming data samples is either swapped (i.e., the order of the logic bits representing the data sample is changed) by swapper 102, or passed through DAC element 102 without being swapped. If the state value is "1," the incoming data samples are swapped. If the state value is "0," the incoming data samples are not swapped.

Each of the incoming data samples in input data stream 108 is also sent to state register 104. Based on the value of each of the incoming data samples, the state value will be updated. The relationship between the incoming data and the state value is shown in Table 1, where $x_0$ and $x_1$ can be either single bits or multi-bit vectors representing an input data sample (e.g., an input data sample in input data stream 108).

TABLE 1

| Current State | Input Bits/Vectors | Next State | Shuffle? |
|---|---|---|---|
| $S_0$ (0) | $x_0 = x_1$ | $S_0$ (0) | No |
| $S_0$ (0) | $x_0 \neq x_1$ | $S_1$ (1) | Yes |
| $S_1$ (1) | $x_0 = x_1$ | $S_1$ (1) | No |
| $S_1$ (1) | $x_0 \neq x_1$ | $S_0$ (0) | No |

Figure 2:
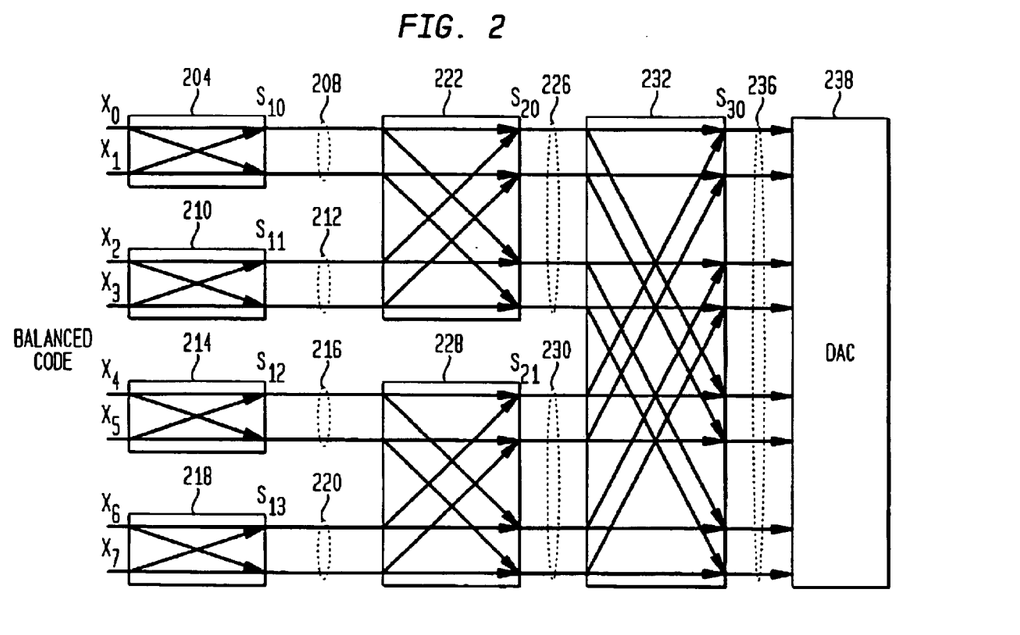
FIG. 2 is an example tree-structured dynamic element matching ("DEM") system.

FIG. 2 is an example of a tree-structured DEM system. Input data sample 202 contains bits $x_0$–$x_7$. Bits $x_0$ and $x_1$ enter swapper 204. Depending on the state $S_{10}$ of swapper 204, bits $x_0$ and $x_1$ are either swapped by or passed through swapper 204 to produce 2-bit bus or vector 208. Similarly, swapper 210 processes $x_2$ and $x_3$ according to state $S_{11}$ to produce bus or vector 212, swapper 214 processes $x_4$ and $x_5$ according to state $S_{12}$ to produce bus or vector 216, and swapper 218 processes $x_6$ and $x_7$ according to state $S_{13}$ to produce bus or vector 220. For ease of description, the term "bus" in this example may represent both a bus and a vector.

Bus 208 and bus 212 then enter swapper 222. Depending on the state $S_{20}$ of swapper 222, buses 208 and 212 are either swapped by or passed through swapper 224 to produce 4-bit bus 226. Similarly, swapper 228 processes buses 216 and 220 according to state $S_{21}$ to produce 4 bit bus 230.

Finally, buses 226 and 230 enter swapper 232. Depending on the state $S_{30}$ of the swapper 232, buses 226 and 230 are either swapped by or passed through swapper 232 to produce 8-bit output stream 236. 8-bit output stream 236 then enters DAC 238.

Figure 3A:
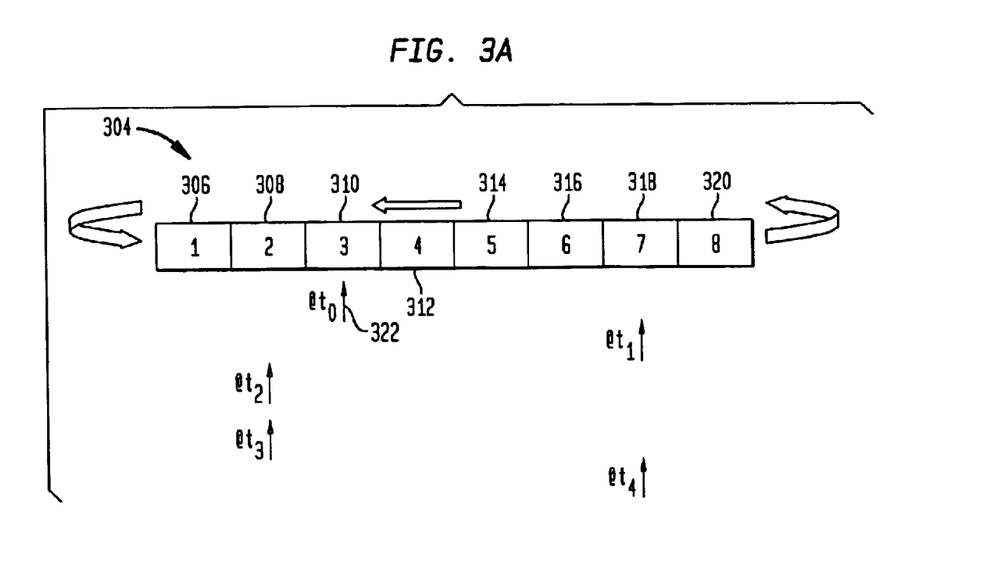
FIG. 3A is a block diagram of an example digital-to-analog converter ("DAC") in conjunction with a pointer system used in data weighted averaging ("DWA") DEM.
Figure 3B:
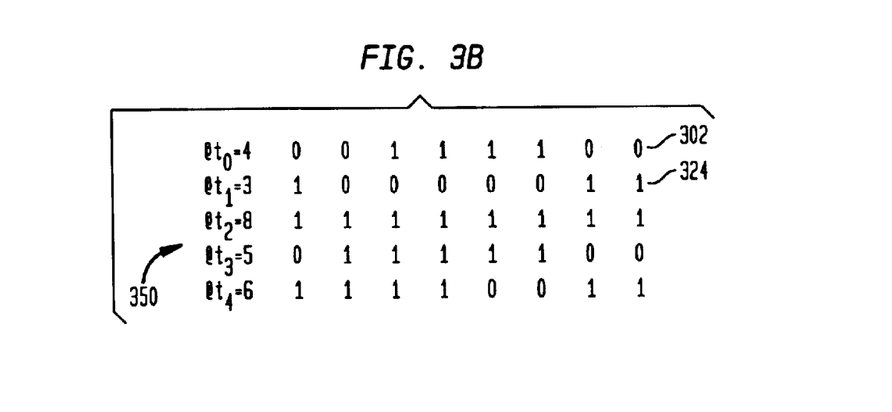
FIG. 3B is a table indicating example data processed by unit DAC elements and the pointer system of FIG. 3A.

DWA DEM is illustrated by way of example with reference to FIGS. 3A and 3B.

FIG. 3A is a block diagram of an example DAC 304 including a series of eight unit DAC elements 306–320. An updatable pointer 322 points to any given one of the DAC elements 306–320.

FIG. 3B is a table 350 including multiple columns, each indicating example data processed by a corresponding DAC element. The rows indicate a progression in time from $t_0$–$t_4$.

With reference to both FIGS. 3A and 3B, DWA DEM cycles bits through unit DAC elements 306–320 in a sequential fashion based on data applied to DAC 304. For example, an 8-bit code sample 302 (FIG. 3B) enters DAC 304. If at time $t_0$ the pointer 322 points to DAC element 310, then the code sample 302 entering DAC 304 at that time $t_0$ will first be sent to DAC element 310. The position of pointer 322 is updated each time a unit DAC element is activated, i.e., each time a "1" from the code sample is processed by the DAC element. Since code sample 302 contains four 1's in this example, the pointer 322 will be positioned (e.g., updated to point) at DAC 318 when the next code sample 324 enters at time $t_1$. This sequential processing continues as shown for each input code sample. Because the pointer is updated only after the DAC element is activated, each DAC element is used as often as every other DAC element, reducing any non-linearity.

Figure 4:
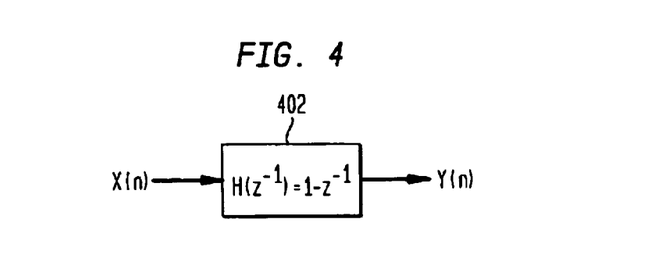
FIG. 4 is a representation of a conventional DEM $H(z^{-1})$ filter.

FIG. 4 shows a conventional DEM filter, where $H(z^{-1}) = (1-z^{-1})$ is a first-order transfer function used by noise-shaping filter 402 ("H($z^{-1}$) filter"). An input sample X(n) enters the filter 402. The filter 402 then performs DEM on input sample X(n) according to the first-order transfer function to produce first-order output sample Y(n).

Figure 5:
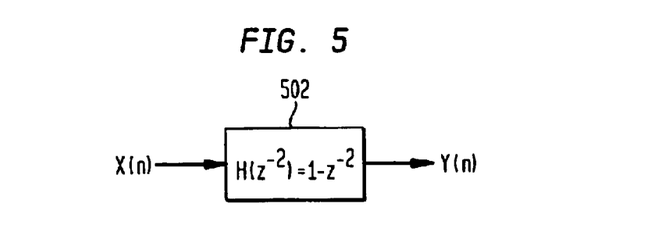
FIG. 5 is a representation of the proposed DEM $H(z^{-2})$ filter.

FIG. 5 shows a DEM fitter according to an embodiment of the present invention, where H($z^{-2}$)=(1−$z^{-2}$) is a second-order transfer function used by noise-shaping filter 502 ("H($z^{-2}$) filter"). The input sample X(n) enters the filter 502. The filter 502 then performs DEM on input sample X(n) according to the second-order transfer function to produce second-order output sample Y(n).

Figure 6:
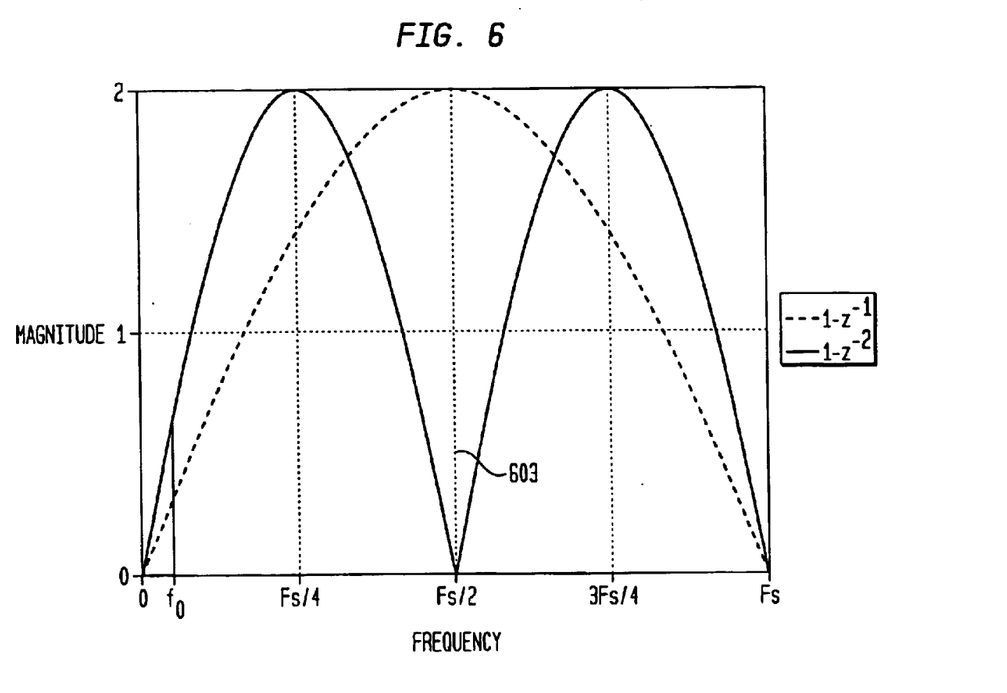
FIG. 6 is a graph of the frequency responses of both a conventional DEM $H(z^{-1})$ system and the proposed DEM $H(z^{-2})$ system.

FIG. 6 shows the effect of the first-order and second-order transfer functions of FIGS. 4 and 5, respectively. FIG. 6 is a graph of the frequency response of the H($z^{-1}$) and H($z^{-2}$) filters, with frequency on the x-axis and magnitude on the y-axis. The H($z^{-1}$) filter is represented by the dashed line; the H($z^{-2}$) filter is represented by the solid line.

Due to a limit-cycle effect in the H($z^{-1}$) filter, there are undesired tones in the neighborhood of Fs/2 in the actual output spectrum of the H($z^{-1}$) filter, especially for weak input signals. These tones could be easily mixed down into the baseband of a Δ-Σ modulator utilizing the filter, and degrade the in-band signal-to-noise ratio ("SNR") performance the modulator. This would cause the signal to bear the annoying tones in the output.

In contrast to the H($z^{-1}$) filter, the H($z^{-2}$) filter frequency response has a null 603 at Fs/2. As shown in FIG. 6, this null 603 substantially removes or eliminates the undesired tones around Fs/2.

There is some in-band SNR degradation of the H($z^{-2}$) compared to H($z^{-1}$) as is illustrated in FIG. 6. The SNR degradation is the ratio of the two noise powers since the signal powers are the same for both cases.

$$D = \frac{\int_0^{f_0} H^2(z^{-1})df}{\int_0^{f_0} H^2(z^{-2})df} = \frac{\int_0^{f_0}(1-e^{-j2\pi ft})df}{\int_0^{f_0}(1-e^{-j4\pi ft})df} =$$

$$\frac{\int_0^{f_0}\sin^2(\pi f T_s)df}{\int_0^{f_0}\sin^2(2\pi f T_s)df} = \frac{\pi/OSR - \sin(\pi/OSR)}{\pi/OSR - \sin(2\pi/OSR)/2}$$

where OSR=$2f_0 T_s$, is the oversampling ratio. D is unity for OSR=1. In other words, the total noise power is the same for both transfer functions. For OSR ≧10, applying Taylor's expansion yields $$D \approx \frac{(\pi/OSR)^3/3!}{(2\pi/OSR)^3/2/3!} = \frac{1}{4}$$

Thus 6 dB degradation incurs for the tone-removal transfer function for the decent OSR. The analysis is based on the assumption that there are no tones for the H($z^{-1}$). Since the tones inside the baseband for H($z^{-1}$) add more noise power, the ratio D is usually less than 6 dB.

Figure 7:
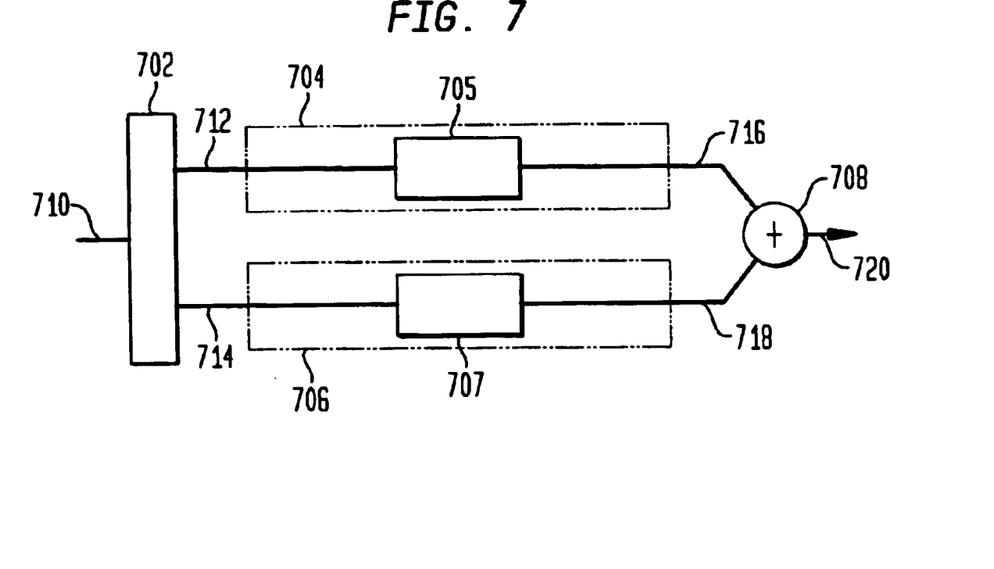
FIG. 7 is a block diagram of an example DEM $H(z^{-2})$ system.

FIG. 7 is a block diagram of an example system 700 of the H($z^{-2}$)=(1−$z^{-2}$) filter for DEM. System 700 comprises an input stage 702, a first stage 704, a second stage 706, and a combiner 708. An input data stream 710, having a sample rate Fs, includes alternating, evenly spaced in time, even and odd input data samples (e.g., X(n)=$x_0$, $x_1$, $x_2$, $x_3$, . . . ). Typically, each of the data samples is time-spaced from the next by one sample period, or 1/Fs. Input stage 702 splits input data stream 710 into an even input data stream 712 and an odd input data stream 714. Even input data stream 712 includes a series of even input data samples (e.g., $X_e(n)$=$x_0$, $x_2$, $x_4$, . . . ) separated in time from one another by two sample periods, or 1/(Fs/2). Odd input data stream 714 includes a series of odd input data samples (e.g., $X_o(n)$=$x_1$, $x_3$, $x_5$, . . . ), separated in time from one another by two sample periods, or 1/(Fs/2).

First stage 704 includes a DEM encoder 705. DEM encoder 705 performs a first DEM operation on each of the even data samples in input data stream 712 to produce shuffled even data samples (e.g., $X_{es}(n)$=$x_{0s}$, $x_{2s}$, $x_{4s}$, . . . ) in a shuffled even data stream 716. Second stage 706 includes a DEM encoder 707. DEM encoder 707 performs a first DEM operation on each of the odd data samples in odd input data stream 714 to produce shuffled odd data samples (e.g., $X_{os}(n)$=$x_{1s}$, $x_{3s}$, $x_{5s}$, . . . ) in a shuffled odd data stream 718. Combiner 710 combines in an alternating manner the shuffled even data samples in shuffled even data stream 716 and the shuffled odd data samples in shuffled odd data stream 718 to produce an output data stream 720 (e.g., $x_s(n)$=$x_{0s}$, $x_{1s}$, $x_{2s}$, $x_{3s}$ . . . ).

Figure 8:
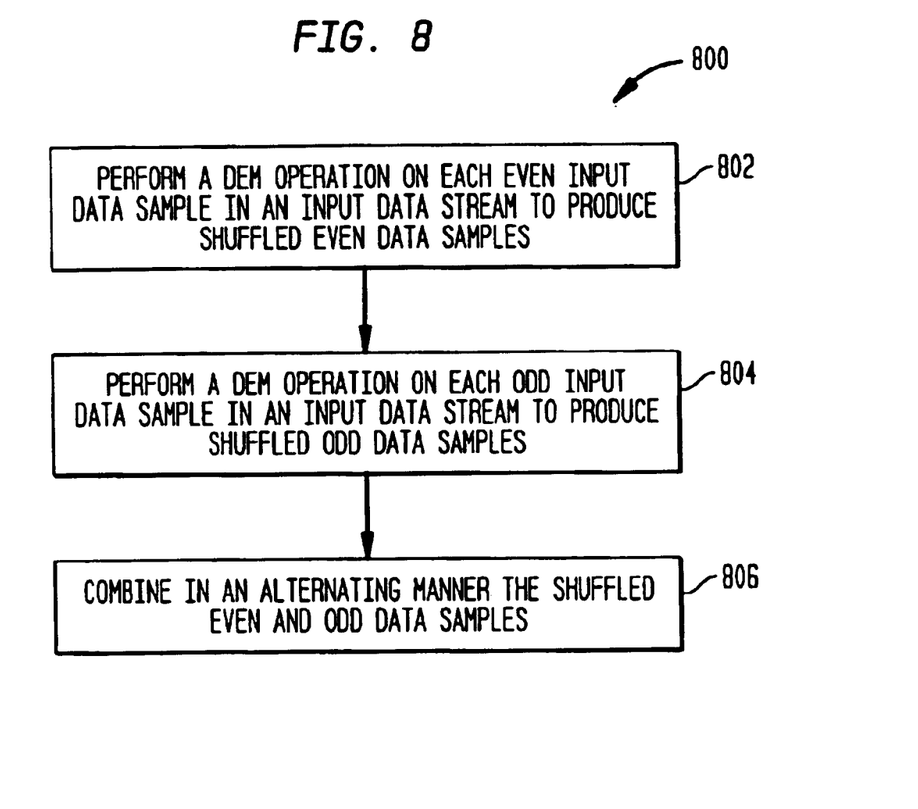
FIG. 8 is a flow chart of a method implementing the present invention.

FIG. 8 summarizes this process in a method 800. In step 802, a DEM operation is performed on each even input data sample in an input data stream having a sample rate Fs to produce shuffled even data samples. The DEM operations are performed at a rate Fs/2. In step 804, a DEM operation is performed on each odd input data sample in the input data stream to produce shuffled odd data samples. The DEM operations are performed at a rate Fs/2. Steps 802 and 804 may be performed consecutively, in reverse, or at the same time. Upon completion of steps 802 and 804, method 800 proceeds to step 806, where the shuffled even and odd data samples are combined in an alternating manner.

Figure 9:
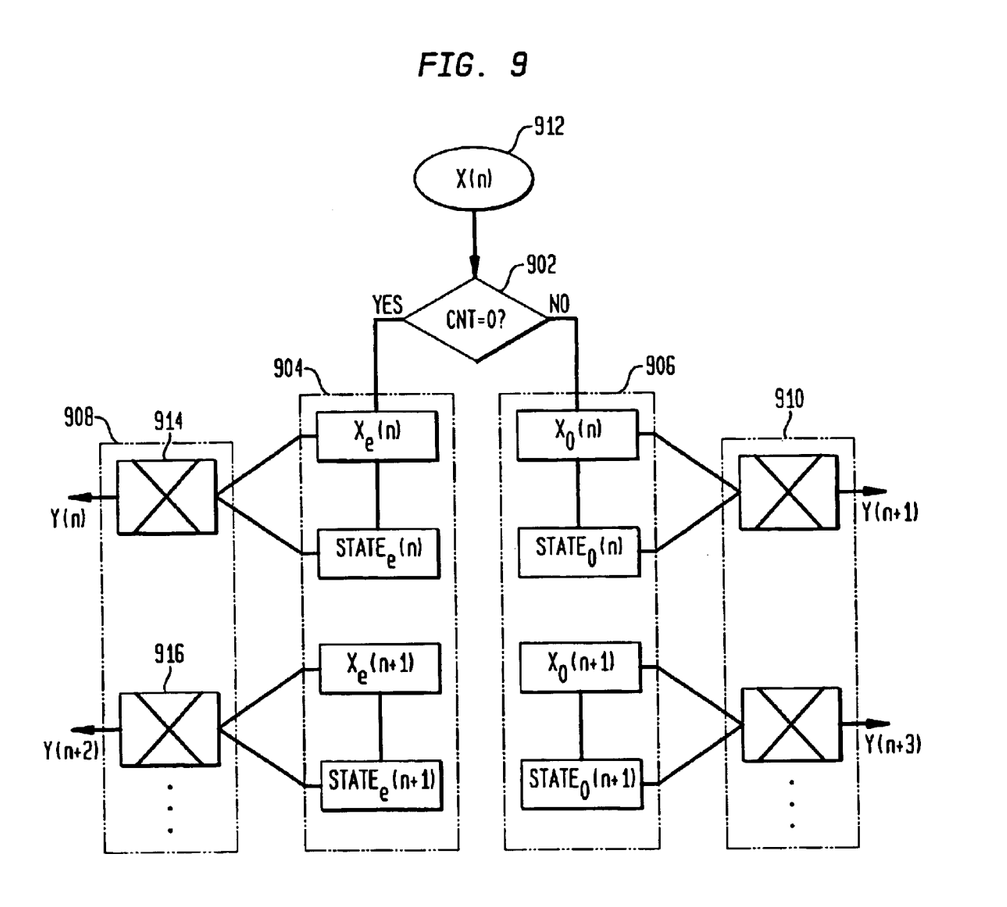
FIG. 9 is a diagram of an example tree-structured DEM system, using state registers.

FIG. 9 is a sample implementation 900 of the method 800. Implementation 900 includes a counter and data diverter 902, an even state register 904, an odd state register 906, an even swapper bank 908, and an odd swapper bank 910. Each swapper in swapper banks 908 and 910 may be used multiple times. An input data stream 912 containing input data samples (not shown) enters counter and data diverter 902. Counter and data diverter 902 includes a 1-bit counter that resets after every other count. Therefore, if the counter is at "0", the incoming data sample is treated as an even incoming data sample and is sent by the counter and data diverter 902 to the even state register 904. If the counter is at "1", the incoming data sample is treated as an odd incoming data sample and is sent by the counter and data diverter 902 to the odd state register 906.

Using the even state register as an example, the even incoming data sample $X_e(n)$ (e.g., $x_0$) is input to a swapper 914 of even swapper bank 908, along with a swapper state $State_e(n)$ of the swapper. Based on the value of even incoming data sample $X_e(n)$ and the value of the state $State_e(n)$, swapper 914 will either shuffle even incoming data sample $X_e(n)$ or pass it through to its output without shuffling to produce an even output data sample Y(n) (e.g., $y_0$). $State_e(n)$ is then updated to $State_e(n+1)$ according to the relationship between the value of $State_e(n)$ and the even incoming data sample $X_e(n+1)$ (e.g., $x_2$), as shown in Table 1, supra.

A next even incoming data sample $X_e(n+1)$ is input to a swapper 916 of even swapper bank 908, along with swapper state $State_e(n+1)$, to produce even output data sample Y(n+2) (e.g., $y_2$). The odd state register 906 treats odd incoming data samples in the same manner. Because of the separation of the even and odd data samples, if the input sample rate is Fs, each even and odd data sample is filtered at ½ the sample rate, or Fs/2.

Figure 10:
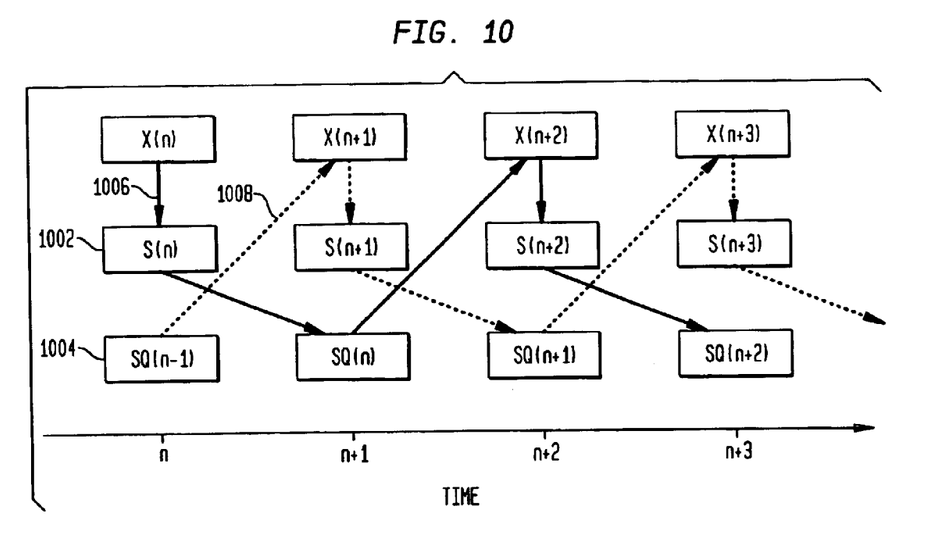
FIG. 10 is a diagram of an example state-delayed tree-structured implementation of the present invention, using shift registers.

FIG. 10 is a diagram of a second implementation for the tree-structured DEM that simplifies and reduces the hardware requirements by removing the counter and data diverter 902, and replacing state registers 904 and 906 with two shift registers 1002 and 1004. This implementation is presented in a timeline fashion so that the interaction between the two shift registers over a period of time may be seen as time increases from left to right in FIG. 10.

At time n, register 1002 contains state S(n). In a conventional tree-structured DEM with $H(z^{-1})$ filtering, state S(n) would be applied to a next data sample X(n+1) (e.g., $x_1$) at time n+1. Next data sample X(n+1) (e.g., $x_1$) would be used to generate state S(n+1). State S(n+1) would then be applied to a next data sample X(n+2) (e.g., $x_2$), and so on. In the conventional structure, shift register 1004 would not be used.

The present invention utilizes $H(z^{-2})$ filtering, not $H(z^{-1})$ filtering. To implement this, shift register 1004 is used to delay state S(n) by one sample period (1/Fs). At time n+1, state S(n) is not applied to next data sample X(n+1), but is instead transferred to shift register 1004, and becomes delayed state SQ(n). At time n+2, delayed state SQ(n) is applied to next data sample X(n+2) (e.g., $x_2$).

To make this more clear, a path 1006 for even-numbered states is represented by the bold arrows, and a path 1008 for odd-numbered states is represented by the dotted arrows. Even numbers are represented by the series of n, n+2, n+4, . . . Odd numbers are represented by the series n−1, n+1, n+3, . . . At time n, even input data sample X(n) is used to generate even state S(n). At time n+1, state S(n) is delayed and shifts to delayed eve state SQ(n). At time n+2, delayed even state SQ(n) is applied to next even input data sample X(n+2).

In the same manner, at time n, delayed odd state SQ(n−1) is in shift register 1004. At time n+1, delayed odd state SQ(n−1) is applied to an incoming odd data sample X(n+1), from which a new odd state S(n+1) is generated. At time n+2, odd state S(n+1) is transferred to shift register 1004, and becomes delayed odd state SQ(n+1). Since even-numbered states are applied only to even data samples, and odd-numbered states are applied only to odd data samples, the state-delay implementation effectively implements the $H(z^{-2})$ filtering for the tree-structured DEM. Because of this delay, if the input data stream sample rate is Fs, each even and odd state is updated at a rate equal to Fs/2.

Figure 11:
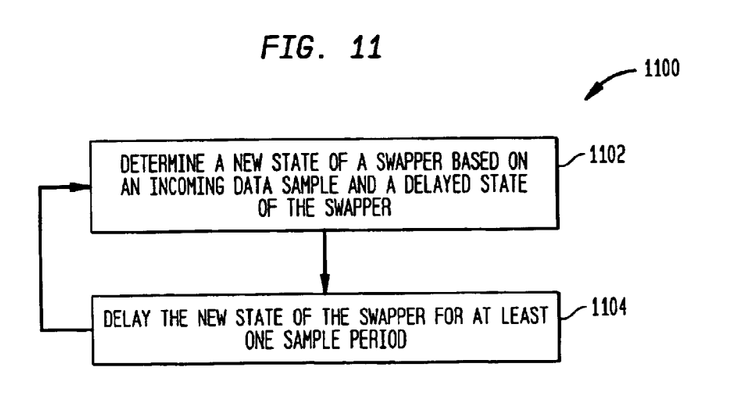
FIG. 11 is a flow chart of a method implementing an example state-delayed delayed tree-structured implementation of the present invention.

FIG. 11 summarizes this process in a two-step, repeating method 1100. In step 1102, a new state of a swapper is determined based on an incoming data sample and a delayed state of the swapper. Then, in step 1104, the new state of the swapper is delayed for at least one sample period. Method 1100 repeats for each incoming data sample.

Figure 12:
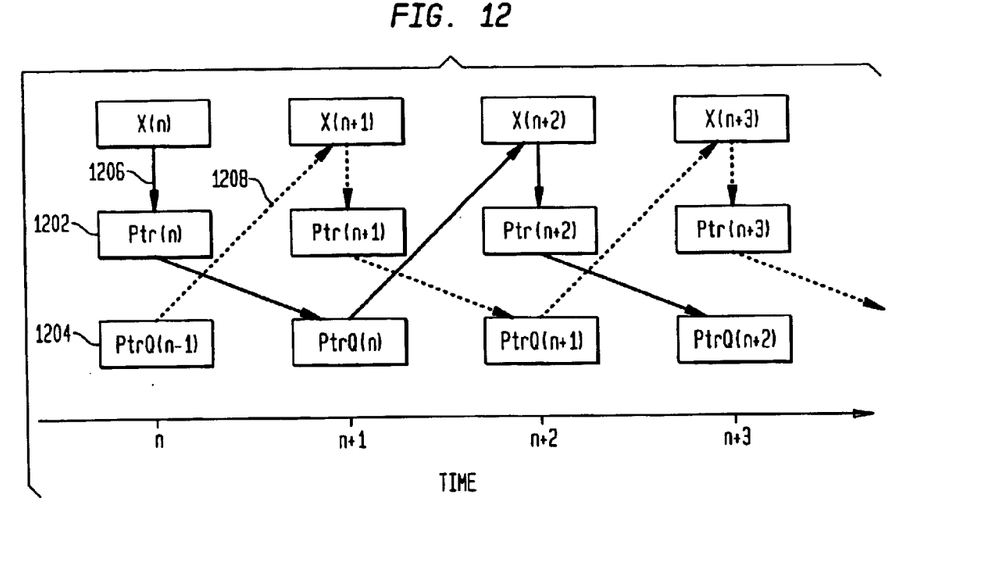
FIG. 12 is a diagram of an example state-delayed data weighted averaging (DWA) implementation of the present invention, using shift registers.

FIG. 12 shows the corresponding state-delayed implementation for DWA DEM. Like the tree-structured DEM, two shift registers 1202 and 1204 are used. For the conventional $H(z^{-1})$ filtering, a current pointer position Ptr(n) contained in register 1202 would be applied to next incoming data sample X(n+1) (e.g., $x_1$) to generate a new pointer position Ptr(n+1). Shift register 1204 would not be used.

In the present invention, however, the delay shift register 1204 is used to hold the value of Ptr(n) for one time cycle. As in FIG. 10, a path 1206 for even-numbered states is represented by the solid arrows, and a path 1208 for odd-numbered states is represented by the dotted arrows. At time n, incoming even data sample X(n) is used to generate an even pointer position Ptr(n). At time n+1, instead of being applied to the next input data sample, which would be odd, pointer position Ptr(n) is shifted to a delayed even pointer position, PtrQ(n). Then, at time n+2, delayed even pointer position PtrQ(n) is applied to next incoming even data sample X(n+2) (e.g., $x_2$). Sample X(n+2) is used to generate a next even pointer position Ptr(n+2).

Similarly, at time n, the odd pointer position is being delayed in shift register 1204 as delayed odd pointer position PtrQ(n−1). At time n+1, delayed odd pointer position PtrQ(n−1) is applied to incoming odd data sample X(n+1) (e.g., $x_1$), which is further used to generate a next odd pointer position Ptr(n+1). At time n+2, odd pointer position Ptr(n+1) is transferred to shift register 1204 and becomes delayed pointer position PtrQ(n+1). In this manner, since even-numbered pointer positions are only used with even data samples, and odd-numbered pointer positions are only used with odd data samples, the present invention effects an $H(z^{-2})$ filter on the incoming data stream.

Figure 13:
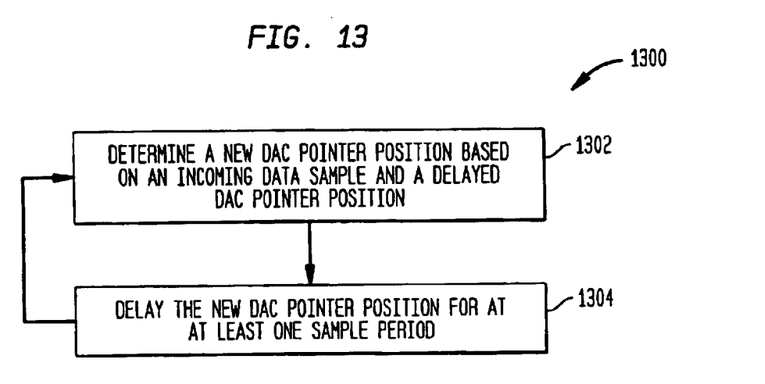
FIG. 13 is a flow chart of a method implementing an example state-delayed DWA implementation of the present invention.

FIG. 13 summarizes this process in a two-step, repeating method 1300. In step 1302, a new DAC pointer position is determined based on an incoming data sample and a delayed DAC pointer position. Then, in step 1304, the new DAC pointer position is delayed for at least one sample period. Method 1300 repeats for each incoming data sample.

Figure 14A:
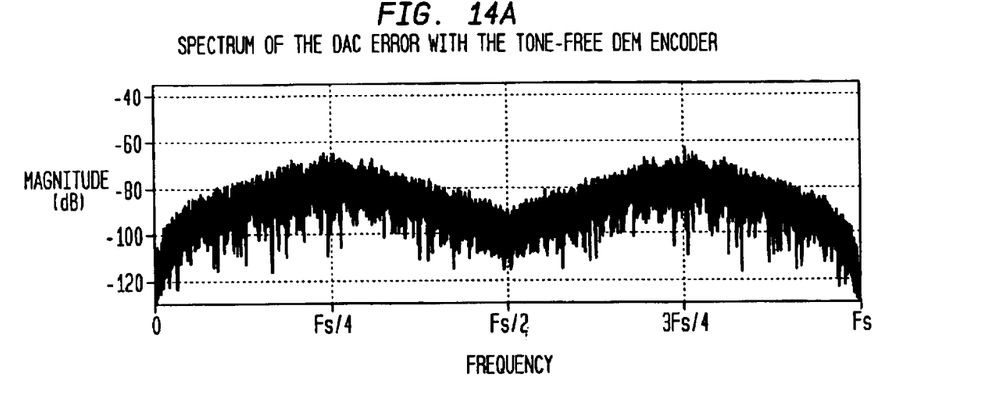
FIG. 14A is a graph of simulated DAC error spectra for a conventional tree-structured DEM system.

FIG. 14A is a graph of a simulated DAC error spectra for an output signal from a conventional tree-structured DEM encoder. It shows a −40 dB Fs/2 tone in the output signal, ten times larger than the input sine magnitude of −60 dB.

Figure 14B:
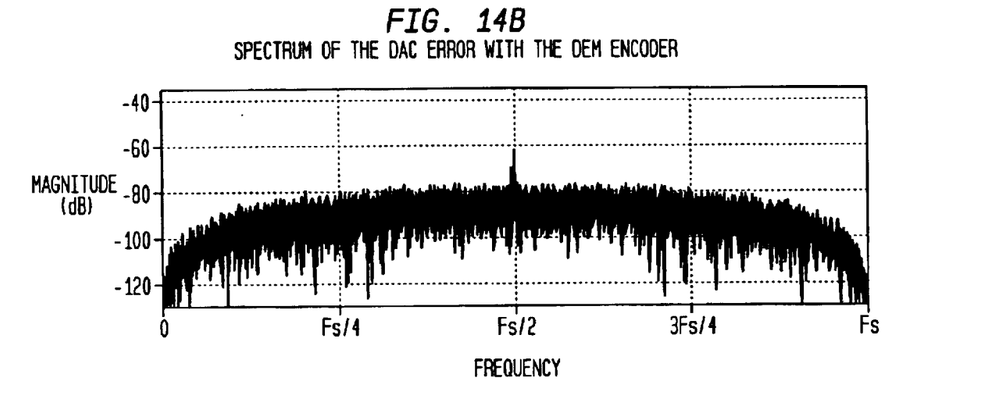
FIG. 14B is a graph of simulated DAC error spectra for the tree-structured DEM system of the present invention.

FIG. 14B is a graph of a simulated DAC error spectra for an output signal from a state-delayed tree-structured DEM encoder implementing the present invention. It has no tones at Fs/2, and its maximum noise level around Fs/4 is below the input signal level of −60 dB, imposing no tone-effect.

Figure 15:
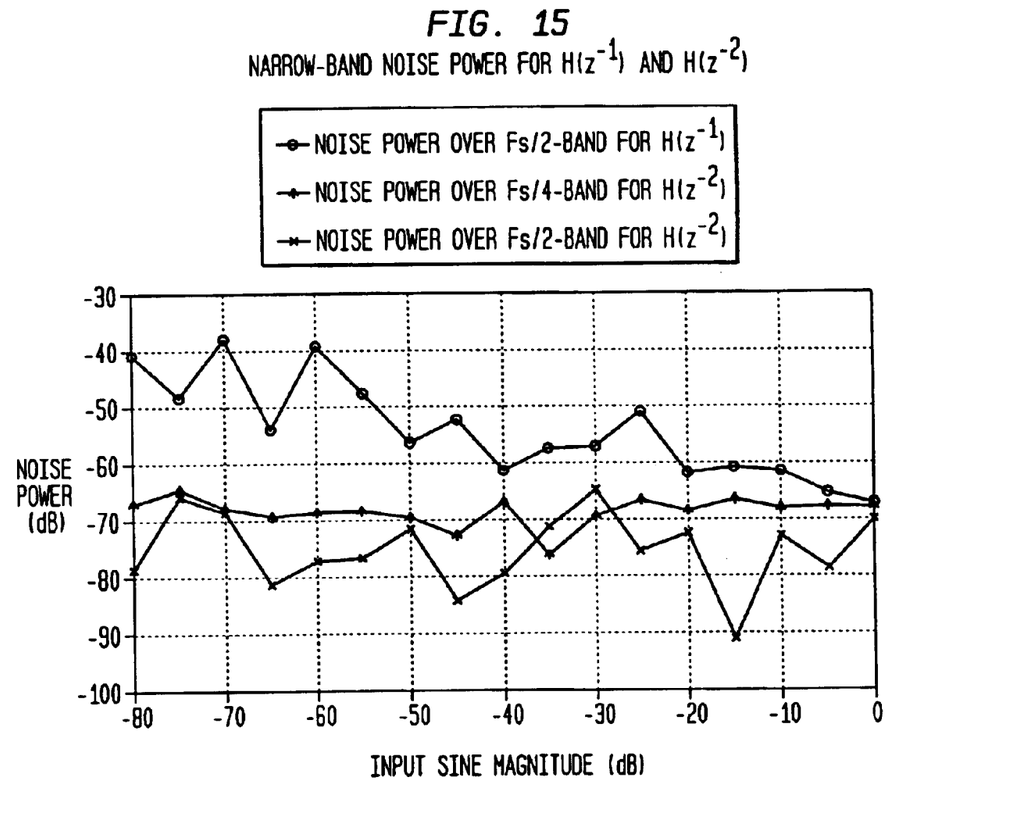
FIG. 15 is a graph of the integrated narrow-band noise powers of two tree-structured DEM systems for the sine inputs with different magnitudes. The graph provides three sets of data: noise power over Fs/2 band for a system using $H(z^{-1})$, noise power over Fs/4 band for a system using $H(z^{-2})$, and noise power over Fs/2 band for the system using $H(z^{-2})$.

FIG. 15 is a graph of the integrated narrow-band noise powers of two tree-structured DEM systems for the sine inputs with different magnitudes. The graph provides three sets of data: noise power over Fs/2 band for a system using $H(z^{-1})$, noise power over Fs/4 band for a system using $H(z^{-2})$, and noise power over Fs/2 band for the system using $H(z^{-2})$. Any extremely high narrow-band noise power is considered to be dangerous, because it could potentially be folded into the baseband of the Δ-Σ modulator utilizing the filter, either by the inter-modulation between any two adjacent tones or by the reference pin modulation. The noise power is integrated over an Fs/2/OSR range around Fs/2 for $H(z^{-1})$ and $H(z^{-2})$, respectively. OSR=60 is being used here. Also for $H(z^{-2})$, it is integrated over the same range around Fs/4, where the maximum PSD occurs.

The noise power around Fs/4 for $H(z^{-2})$ is about 20 dB smaller than noise power around Fs/2 for $H(z^{-1})$ for small input levels such as −45 dB or less. For large input signals, although the noise power around Fs/2 appears to be small for $H(z^{-1})$, it is actually because the Fs/2 tones spread well beyond the integration range. The Fs/2 tones indeed exist for both the large and the small inputs for $H(z^{-1})$, while they do not for $H(z^{-2})$. In the present invention, because the odd and even samples of an input data stream independently choose their own unit DAC elements, it is more difficult to form the patterns needed for the Fs/4 tones than for the Fs/2 tones.

For $H(z^{-2})$, normally the noise power around Fs/2 is lower than the noise power around Fs/4. However, in FIG. 15, the noise power around Fs/2 for the −30 dB input is higher than the noise power around Fs/4. It is actually because in this particular case the input DAC error spectrum is not flat, having a gradually rising PSD from −90 dB at DC to about −80 dB at Fs/2, due to the random number picked for the DAC error in the simulation. There is comparable noise power around Fs/2 and around Fs/4, when the large input noise power around Fs/2 cascaded with the $H(z^{-2})$ filter.

However, for the normally flat or almost flat input DAC error spectrum, the noise power around Fs/4 is less than the noise power around Fs/2.

Figure 16A:
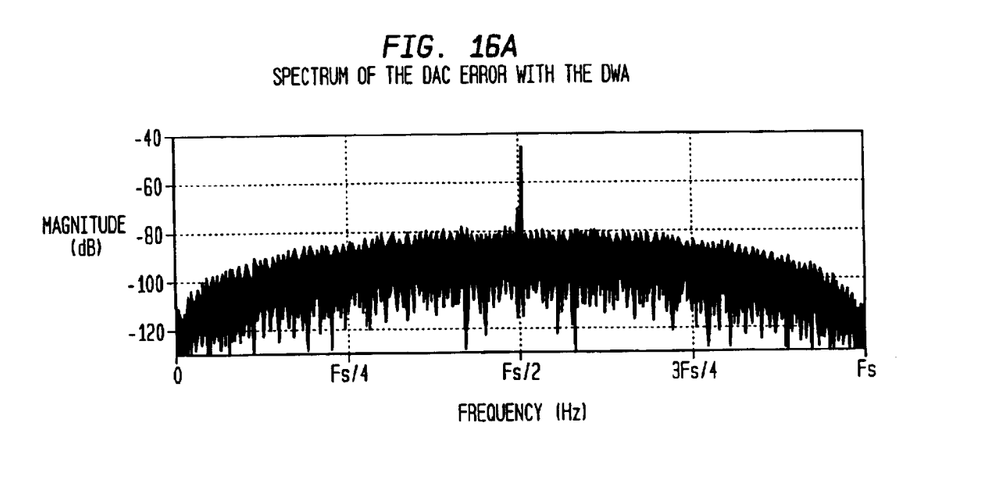
FIG. 16A is a graph of simulated DAC error spectra for a conventional DWA DEM system.

FIG. 16A shows the simulated DAC error spectra for a conventional DWA system, with an input sine magnitude of −48 dB. The amplitude is modulated with −40 dB Fs/2 tones.

Figure 16B:
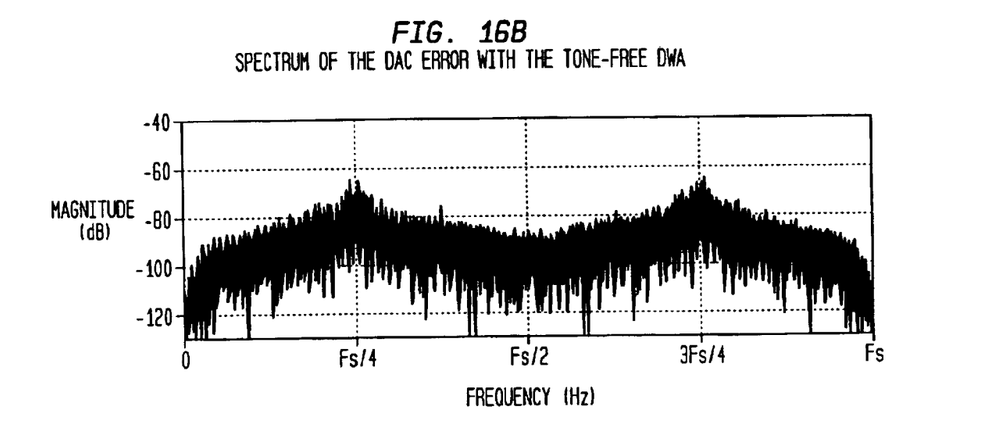
FIG. 16B is a graph of simulated DAC error spectra for the DWA DEM system of the present invention.

FIG. 16B shows the simulated DAC error spectra for a state-delayed DWA system implementing the present invention. No tones around Fs/2 are seen in this plot. Also, the noise power around Fs/4 in FIG. 16B is lower than the noise power around Fs/2 in FIG. 16A.

Thus, the present invention makes use of the null at Fs/2 of the $H(z^{-2})$ filter to remove the Fs/2 tones produced by convention DEM while maintaining a statistical performance degradation of SNR less than 6 dB compared to the conventional system.

Although the preferred embodiment uses an $H(z^{-2})$ filter, the concept can easily be extended to using higher-order filters. For example, an $H(z^{-3})=1-z^{-3}$ filter, having two nulls in the frequency response of FIG. 6, excluding the nulls at DC and Fs, can also remove tones. In this case, there is more than one stage in FIG. 7, which is combined with the top two branches into the combiner 708. Also, instead of splitting every other sample into even and odd data streams, every third sample would be sent to one of three data streams.

In general, an $H(z^{-n})=1-z^{-n}$ filter has n−1 nulls, excluding the nulls at DC and Fs, and the corresponding structure in FIG. 7 has n branches. Unfortunately, there is no real advantage in using filters with orders of more than $h(z^{-2})$, because the SNR degradation is greater for higher order filters.

What is claimed is:

1. A method of removing residual tones in a shuffled output data stream, comprising:

(a) separating an input data stream into alternating even input data samples and odd input data samples, wherein the input data stream has a data sample rate equal to Fs;

(b) shuffling each of the even input data samples to produce shuffled even data samples;

(c) shuffling each of the odd input data samples to produce shuffled odd data samples; and (d) combining in an alternating manner the shuffled even and odd data samples to produce the shuffled output data stream.

2. The method of claim 1, wherein said steps (b) and (c) are performed approximately simultaneously.

3. The method of claim 1, wherein each of steps (b) and (c) comprises shuffling in accordance with an $H(z^{-1})$ transfer function, such that the combining in step (d) effects a shuffling in accordance with an $H(z^{-2})$ transfer function, wherein $H(z^{-n})$ is defined as $H(z^{-n})=(1-z^{-n})$.

4. The method of claim 1, wherein each of steps (b) and (c) comprises shuffling at one-half the sample rate Fs.

5. The method of claim 1, wherein:

said shuffling in said step (b) comprises swapping the even input data samples of the input data stream based on values of the even input data samples and an even state; and said shuffling in said step (c) comprises swapping the odd input data samples of the input data stream based on values of the odd input data samples and an odd state.

6. The method of claim 5, wherein said shuffling in said step (b) further comprises swapping according to the following rules:

| Current Even State | Even Input | Next Even State | Swap? Yes or No |
|---|---|---|---|
| $S_0$ (0) | $x_0 = x_1$ | $S_0$ (0) | No |
| $S_0$ (0) | $x_0 \neq x_1$ | $S_1$ (1) | Yes |
| $S_1$ (1) | $x_0 = x_1$ | $S_1$ (1) | No |
| $S_1$ (1) | $x_0 \neq x_1$ | $S_0$ (0) | No | wherein $x_0$ and $x_1$ are bits in a given even input data sample; and the next even state is a result of updating the current even state.

7. The method of claim 1, wherein:

said shuffling in said step (b) comprises choosing a unit digital-to-analog (DAC) element for the even input data samples of the input data stream based on values of the even input data samples and an even DAC pointer position; and said shuffling in said step (c) comprises choosing a unit DAC element for the odd input data samples of the input data stream based on values of the odd input data samples and an odd DAC pointer position.

8. A method of removing residual tones in a shuffled output data stream having samples separated by one sample period, comprising:

(a) determining a new state of a swapper based on an incoming data sample and a current state of the swapper, wherein the current state of the swapper has been delayed for at least one sample period;

(b) delaying the new state of the swapper for at least one sample period; and (c) repeating steps (a) and (b) for each incoming data sample.

9. A system that performs dynamic element matching (DEM) on an input data stream having a sample rate equal to Fs, the input data stream including alternating even and odd input data samples, said system comprising:

(a) means for performing a DEM operation on each of the even input data samples to produce shuffled even data samples;

(b) means for performing a DEM operation on each of the odd input data samples to produce shuffled odd data samples; and (c) means for combining in an alternating manner the shuffled even and odd data samples to produce an output data stream, wherein said system substantially reduces Fs/2 tones produced in the output data stream by each of said means for performing a DEM operation.

10. The system of claim 9, wherein each of said elements (a) and (b) comprises means for performing a DEM operation in accordance with an $H(z^{-1})$ transfer function, such that said element (c) effects a DEM operation in accordance with an $H(z^{-2})$ transfer function, wherein $H(z^{-n})$ is defined as $H(z^{-n})=(1-z^{-n})$.

11. The system of claim 9, wherein each of said elements (a) and (b) comprises a means for performing DEM operations at one-half the sample rate Fs.

12. The system of claim 9, wherein said element (a) comprises a means for performing a tree-structured DEM operation on each of the even input data samples; and said element (b) comprises a means for performing a tree-structured DEM operation on each of the odd input data samples.

13. The system of claim 12, wherein each of said means for performing said DEM operation has a state value, and follows the following rules:

| Current State | Input | Next Even State | Swap? Yes or No |
|---|---|---|---|
| $S_0$ (0) | $x_0 = x_1$ | $S_0$ (0) | No |
| $S_0$ (0) | $x_0 \neq x_1$ | $S_1$ (1) | Yes |
| $S_1$ (1) | $x_0 = x_1$ | $S_1$ (1) | No |
| $S_1$ (1) | $x_0 \neq x_1$ | $S_0$ (0) | No | wherein $x_0$ and $x_1$ are bits in a given input data sample; and a next state is a result of updating a current state.

14. The system of claim 13, wherein $x_0$ and $x_1$ represent multi-bit vectors.

15. The system of claim 9, wherein said element (a) comprises means for performing a data weighted averaging (DWA) DEM operation on each of the even input data samples; and said element (b) comprises means for performing a DWA DEM operation on each of the odd input data samples.

* * * * *